United States Patent
Min et al.

(10) Patent No.: US 7,410,876 B1
(45) Date of Patent: Aug. 12, 2008

(54) METHODOLOGY TO REDUCE SOI FLOATING-BODY EFFECT

(75) Inventors: Byoung W. Min, Austin, TX (US); Jon D. Cheek, Cedar Park, TX (US); Venkat R. Kolagunta, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/784,561

(22) Filed: Apr. 5, 2007

(51) Int. Cl.
*H01L 21/336* (2006.01)
*H01L 21/425* (2006.01)
*H01L 21/84* (2006.01)

(52) U.S. Cl. .............. 438/301; 438/151; 438/303; 438/305; 438/514; 438/595; 438/518; 257/E21.345; 257/E21.633; 257/E21.634

(58) Field of Classification Search ........... 438/151, 438/301, 303, 305, 514, 518, 595; 257/E21.345, 257/E21.633, E21.634
See application file for complete search history.

(56) References Cited

U.S. PATENT DOCUMENTS

| | | | |
|---|---|---|---|
| 5,780,912 A | 7/1998 | Burr et al. | |
| 6,534,373 B1 | 3/2003 | Yu | |
| 6,855,592 B2 * | 2/2005 | Lee | 438/231 |
| 6,916,716 B1 | 7/2005 | Goad et al. | |
| 7,118,980 B2 | 10/2006 | Jain | |
| 7,354,839 B2 * | 4/2008 | Wei et al. | 438/305 |
| 2005/0136623 A1 | 6/2005 | Tan et al. | |
| 2005/0164461 A1 | 7/2005 | Chen et al. | |
| 2006/0043430 A1 | 3/2006 | Feudel et al. | |
| 2006/0216899 A1 * | 9/2006 | Chen | 438/301 |
| 2006/0252213 A1 | 11/2006 | Chen | |
| 2006/0284249 A1 * | 12/2006 | Chen et al. | 257/344 |
| 2007/0037326 A1 * | 2/2007 | Chen et al. | 438/151 |
| 2007/0252205 A1 * | 11/2007 | Hoentschel et al. | 257/347 |

OTHER PUBLICATIONS

Wei, H.F. et al., "Improvement of Breakdown Voltage and Off-State Leakage in Ge-Implanted SOI n-MOSFETs"; IEEE, 1993, pp. IEDM 93-739-742.
Ohno, T. et al., "Supp. of the Parasitic Bipolar Effect in Ultra-Thin-Film nMOSFETs/SIMOX by Ar Ion Implant. into Source/Drain Regions"; 1995, IEEE, pp. IEDM 95-627-630.
Chen, Vincent M.C. and Woo, Jason C.S., "Tunneling Source-Body Contact for Partially-Depleted SOI MOSFET"; IEEE Trans. on Elect. Dev., V. 44, No. 7, Jul. 1997, pp. 1143-1147.

(Continued)

*Primary Examiner*—Scott B. Geyer
*Assistant Examiner*—Mohsen Ahmadi
(74) *Attorney, Agent, or Firm*—John A. Fortkort; Fortkort & Houston P.C.

(57) ABSTRACT

A method for making a semiconductor device, comprising (a) providing a structure comprising a gate electrode (207) disposed on a substrate (203); (b) creating first (213) and second (214) pre-amorphization implant regions in the substrate such that the first and second pre-amorphization implant regions are asymmetrically disposed with respect to said gate electrode; (c) creating first (219) and second (220) spacer structures adjacent to first and second sides of the gate electrode, wherein the first and second spacer structures overlap the first and second pre-amorphization implant regions; and (d) creating source (217) and drain (218) regions in the substrate adjacent, respectively, to the first and second spacer structures.

19 Claims, 6 Drawing Sheets

OTHER PUBLICATIONS

Chang, D. et al., "Efficacy of Ar in Reducing the Kink Effect on Floating-Body NFD/SOI CMOS"; Proceedings 1998 EIII International SOI Conference; Oct. 1998; pp. 155-156.

Matloubian, M., "Smart Body Contact for SOI MOSFETs", Semiconductor Process and Design Center, Texas Instruments Inc.; Intl. SOI Conf., 1989, pp. 128-129.

Bergaud, C. et al., "Formation of Implanted Piezoresistors Under 100-NM Thick for Nanoelectromechanical Systems"; IEEE, 2002, pp. 360-363.

Borland, John O. et al., "Applying Equivalent Scaling to USJ Implantation"; Semiconductor International; Jan. 1, 2005; 8 pages; www.reed-electronics.com/semiconductor.

Borland, John.; "Implantation and Annealing Options for 65 nm Node SDE Formation"; Apr. 1, 2003; 2 pages; www.reed-electronics.com/semiconductor.

* cited by examiner

METHODOLOGY TO REDUCE SOI FLOATING-BODY EFFECT

FIELD OF THE DISCLOSURE

The present disclosure relates generally to semiconductor devices built on SOI layers, and more particularly to methods for controlling the floating body effect in SOI MOSFETs.

BACKGROUND OF THE DISCLOSURE

In the past, Metal Oxide Semiconductor Field Effect Transistors (MOSFETs) were frequently fabricated as bulk semiconductor devices in which the device features were defined on the surface of a bulk semiconductor wafer. However, as MOSFET devices have continued to shrink in size, and as the transistor densities in these devices have increased accordingly, the disadvantages associated with bulk MOSFETs have become increasingly apparent. These disadvantages include an often less than ideal sub-threshold voltage rolloff, short channel effects, drain induced barrier lowering, high junction capacitance, ineffective isolation, and low saturation current.

As a result, many MOSFET devices today are fabricated on Semiconductor-On-Insulator (SOI) wafers rather than on bulk substrates. SOI wafers feature a thin semiconductor layer which is disposed over a (typically oxide) dielectric layer. Transistors fabricated on such wafers offer the potential of superior performance characteristics due to the thin film nature of the semiconductor substrate and the electrically insulating properties of the underlying dielectric layer. Hence, compared to analogous bulk devices, SOI MOSFETs may manifest superior short channel performance, near-ideal subthreshold voltage swings (which results in low off-state current leakage), and high saturation current.

However, despite their advantages, SOI devices present their own set of challenges. One of these challenges is the floating-body effect, a phenomenon manifested as a decrease in voltage between the source and the drain regions. This effect is especially problematic for partially depleted SOI MOSFETs of the type currently used in some memory devices.

DETAILED DESCRIPTION

Figure 1:
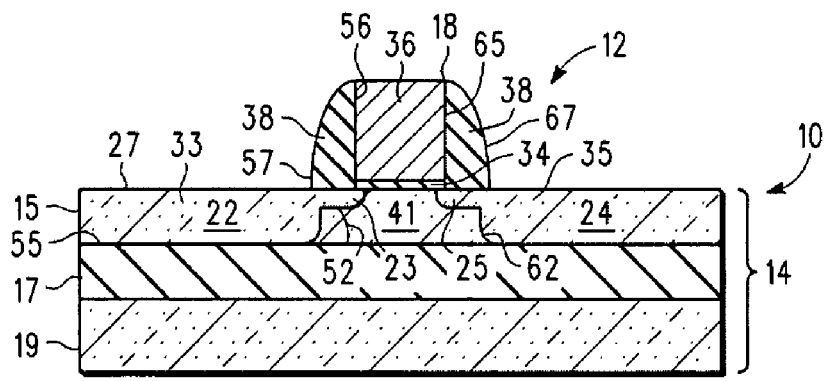
FIG. 1 is an illustration of a step in a prior art process for making a MOSFET device.

In one aspect, a method for making a semiconductor device is provided. In accordance with the method, a structure is provided which comprises a gate electrode disposed on a substrate. First and second pre-amorphization implant regions are created in the substrate such that the first and second pre-amorphization implant regions are asymmetrically disposed with respect to said gate electrode. First and second spacer structures are created adjacent to first and second sides of the gate electrode such that the first and second spacer structures overlap the first and second pre-amorphization implant regions, respectively. Source and drain regions are then created in the substrate adjacent, respectively, to the first and second spacer structures.

Without wishing to be bound by theory, the floating-body effect is believed to be caused by impact ionization in the channel region during on-state operation. Such impact ionization typically occurs near the drain side of the channel region. As a result, carriers accumulate in the body of the SOI transistor, thereby increasing the potential between the channel region and the drain region. The increased potential reduces the threshold voltage of the transistor which, in turn, adversely affects the stability and power consumption of the transistor, increases its off-state and on-state current, and adversely affects the stability of the device.

In the case of SOI MOSFETs, the floating-body effect gives rise to so-called "history effects". These effects can eliminate many of the high performance benefits of SOI technology. History effects arise from fluctuations in the body potential of a transistor. The body potential of a transistor in the off-state is determined by the balance of the PN junction current flowing between the source, drain and body regions of the device. When circuit operation commences, the body potential of the transistor fluctuates briefly due to the influence of capacitive coupling between the gate, source, drain and body regions, in addition to the influence of the PN junction current.

Although the body potential immediately after commencement of circuit operation is influenced by the body potential of the device in the off-state of the circuit, this potential changes as the circuit continues to operate, and in some cases reaches a fixed value. Until that fixed value is reached, the drain current of the transistor continues to fluctuate due to the fluctuations in the body potential.

These fluctuations in drain current and capacitive coupling induce fluctuations in the frequency of operation of the circuitry of the device, and affect the clock signal supplied to circuits connected to the gated clock circuit. This fluctuation in the frequency of the clock signal is known in the art as a "history effect". In other words, the operation of the clock distribution circuit in the state of stopping distribution of a clock signal is in an unstable state for a certain period of time after starting its operation, due to the foregoing difference between the body potential of the SOI device in a stopped state and the stable body potential of the SOI device during operation.

In light of the foregoing, there is a need in the art for a method for controlling the floating body effect and the associated history effects in SOI transistors. In particular, there is a need in the art for controlling the floating body effect and the associated history effects in partially depleted MOSFETs. These and other needs may be addressed by the methodologies and devices disclosed herein.

It has now been found that control of the floating body effect may be obtained through the provision of recombination centers in the source side of a transistor, which quickly drop the body potential of the device. These recombination centers may be formed through the selective implantation at a highly tilted angle of an appropriate species, such as, for example, Ar, Ge or Xe, at the source side of the transistor.

Figure 2:
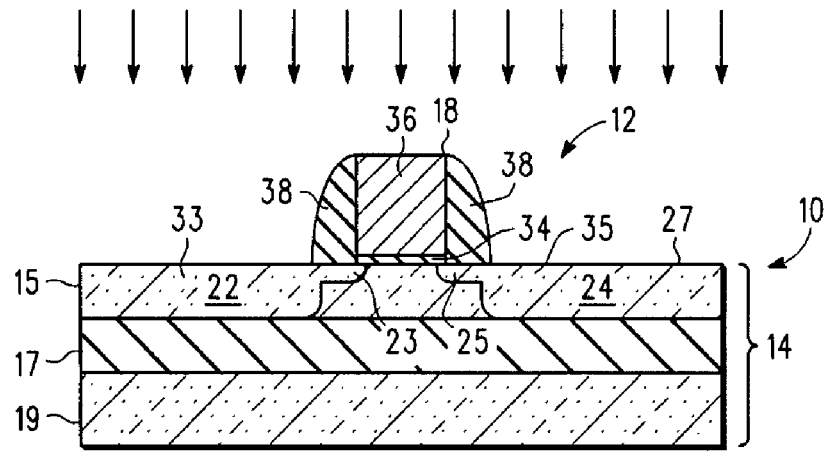
FIG. 2 is an illustration of a step in a prior art process for making a MOSFET device.
Figure 3:
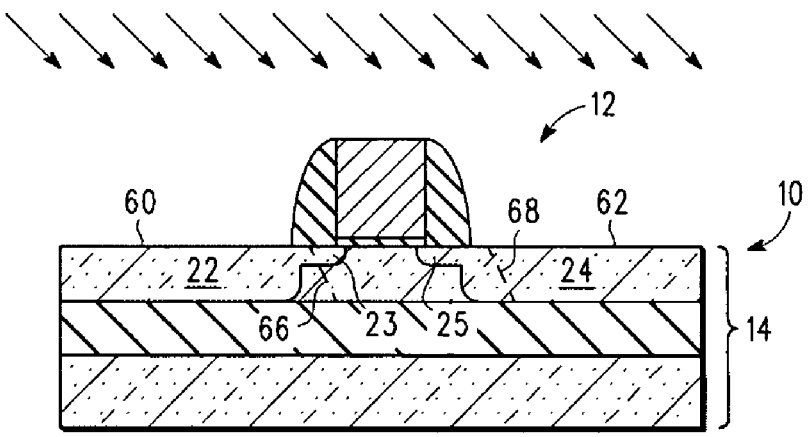
FIG. 3 is an illustration of a step in a prior art process for making a MOSFET device.

The devices and methodologies described herein may be better understood in light of the process depicted in FIGS. 1-3, which is a prior art process for making a semiconductor device.

With reference to FIG. 1, an SOI MOSFET 12 is provided. The SOI MOSFET 12 comprises a substrate 14 which includes a semiconductor-on-insulator (SOI) semiconductor layer 15, a dielectric layer 17, and a semiconductor substrate layer 19. The SOI MOSFET 12 further includes a gate structure 18, a source region 22, and a drain region 24. The source 22 and drain 24 regions extend from the top 27 to the bottom 55 of the SOI layer 15 (top surface of layer 17), and include source extension 23 and drain extension 25 regions, respectively. For an N-channel transistor, regions 22 and 24 are heavily doped with N-type dopants, while for a P-channel transistor, regions 22 and 24 are heavily doped with P-type dopants.

The gate structure 18 also includes a pair of spacers 38, and a gate electrode 36 disposed between a source location associated with region 22 and a drain location associated with region 24. The gate structure 18 is placed over a channel region 41 disposed between extensions 23 and 25. Drain region 24 includes deep drain region 35, and source region 22 includes deep source region 33. Regions 33 and 35 are deeper than extensions 23 and 25. Source region 22 includes an abrupt junction 52 extending in a vertical direction from extension 23 to bottom 55.

The junction 52 is disposed underneath spacer 38 closer to an edge 56 of the gate electrode 36 than an edge 57 of spacer 38. In contrast, a junction 62 (below extension 25) of drain region 24 is disposed closer to an edge 67 of spacer 38 than an edge 65 of the gate electrode 36. Accordingly, the source region 22 and drain region 24 are asymmetrical.

The recombination between electrons and holes at junction 52 helps reduce floating body potential buildup, and hence reduces floating body effects. The carriers are electrons for N-channel MOSFETs and holes for P-channel MOSFETs. Thus, junction 52 is a very abrupt junction disposed in the subsurface of the source-body junction (e.g., the interface between region 22 and region 41), thereby providing high carrier injection from source region 22.

Certain steps in the fabrication of the transistor of FIG. 1 are illustrated in FIGS. 2-3. Thus, FIG. 2 illustrates a conventional double implant process which is used to form source 22 and drain 24 regions, including extensions 23 and 25 thereof. The dopants for the source region 22 and drain region 24 are medium or light mass dopants, such as boron. After the implant process, a high temperature annealing process may be performed. The high temperature annealing process may be a rapid thermal anneal (RTA) to activate the dopants in regions 22 and 24. The high temperature anneal process used to activate the dopants will also concurrently anneal most of the damage caused by the implant process.

With reference to FIG. 3, the structure is then subjected to an angled dopant implant to form the junction 52 (see FIG. 1). The angled dopant implant may be performed at an angle of 20°-70° from a top surface 27 of layer 15 (see FIG. 1). The N-type regions delineated by dashed lines 66 and 68 (for an N-channel transistor) may be formed with an N-type dopant, such as arsenic. The implant extends from the top surface 27 to bottom 55 of layer 15.

Due to the tilt angle associated with the angled dopant implant, line 66 extends underneath gate structure 18 while line 68 is set apart from gate structure 18. The shadowing effect associated with gate structure 18 protects the area underneath extension 25 from the N-type dopants. Alternatively, for a P-channel transistor, P-type dopants, such as Indium, may be used to form P-type regions delineated by dashed lines 66 and 68. The regions defined by lines 66 and 68 can be amorphous or partially amorphous due to the implantation step.

Portion 10 is subjected to a laser annealing process. Preferably, the regions defined by dashed lines 66 and 68 become molten and are recrystallized after the laser beam is removed. The recrystallization process forms an abrupt junction 52 (an abrupt lateral junction on the source side of transistor 12). The annealing process can raise the temperature of regions defined by lines 66 and 68 to the melting temperature of the regions (1100° C. for amorphous silicon germanium). The melting temperature of the regions in the amorphous state is significantly lower than that of substrate 14 (layer 15) which is in a crystalline state. The laser fluence may be controlled so that the regions defined by lines 66 and 68 are fully melted and layer 15 is not melted. After the laser beam is removed, regions defined by lines 66 and 68 are recrystallized as a single crystalline material. The annealing process can be a solid phase epitaxy process. After annealing, conventional fabrication processes and techniques can be utilized to form silicide layers, interconnects, contacts, and the like.

Figure 4:
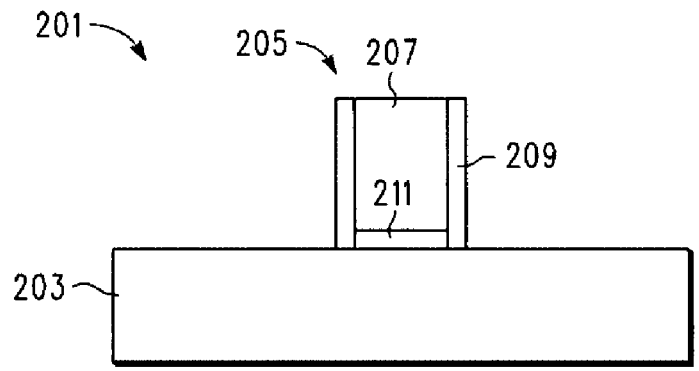
FIG. 4 is an illustration of a step in a process for making a MOSFET device in accordance with the teachings herein.

FIGS. 4-8 illustrate a first particular, non-limiting embodiment of a process for making an SOI transistor in accordance with the teachings herein. With reference to FIG. 4, a semiconductor structure 201 is provided which comprises an SOI layer 203 having a gate structure 205 defined thereon. The gate structure 205 comprises a gate electrode 207 insulated from the SOI layer 203 by way of a gate oxide 211. The sides of the gate electrode 207 are likewise covered with a layer of oxide 209 which may have a composition which is the same as, or different from, the composition of gate oxide 211.

Figure 5:
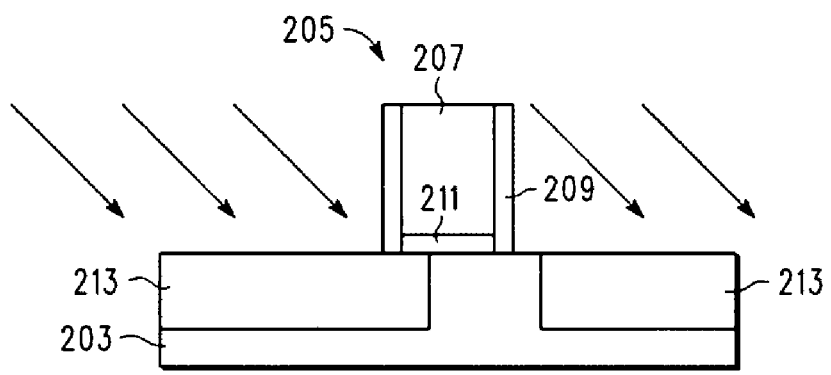
FIG. 5 is an illustration of a step in a process for making a MOSFET device in accordance with the teachings herein.

Referring now to FIG. 5, the structure is subjected to pre-amorphization implantation (PAI) with an ion beam to form first 213 and second 213 amorphized implant regions. The PAI may be accomplished by implanting a suitable impurity (such as, for example, Si, Ge, Sb, In, As, P, $BF_2$, Xe or Ar) of a first conductivity type into the SOI layer 203 at a high tilt angle. The conductivity type of the impurity used in this step is neutral or preferably opposite to the conductivity type of the dopant type used in the later formed source 217 and drain 218 regions (see FIG. 8).

The tilt angle used for the pre-amorphization implantation (as measured with respect to an axis perpendicular to the substrate) is preferably within the range of about 20° to about 70°, more preferably within the range of about 30° to about 60°, and most preferably within the range of about 40° to about 50°. The use of a high angle for this implantation step has a shadowing effect (that is, the portion of the amorphized implant region 213 on the source side of the gate structure 205 extends underneath the gate structure 205, while the portion of the amorphized implant region 213 on the drain side of the gate structure 205 is spaced apart from the gate structure 205). The amorphized implant region 213 may have characteristics which vary with depth. For example, the degree of crystallinity may vary as a function of depth throughout the amorphized implant region 213.

Figure 6:
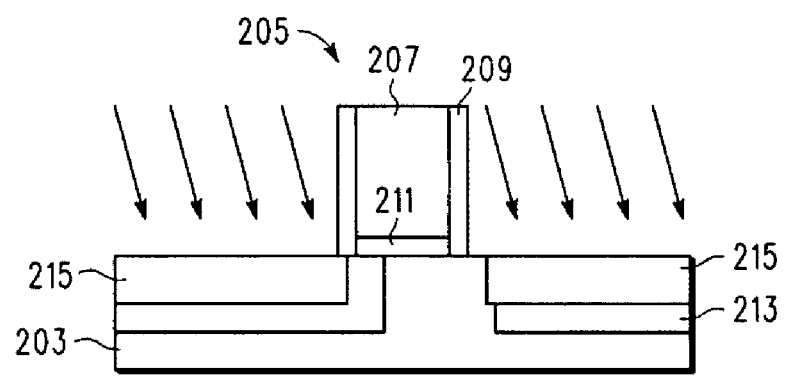
FIG. 6 is an illustration of a step in a process for making a MOSFET device in accordance with the teachings herein.

With reference to FIG. 6, source 215 and drain 215 extension regions are then created by implantation of a species of a second conductivity type using the gate structure 205 as an implant mask. The implantation is performed at a steeper (but nonzero) angle compared to the PAI implant, and hence the source 215 and drain 215 extension regions are formed asymmetrically about the gate electrode 207. The angle for this implantation (as measured with respect to an axis perpendicular to the substrate) is preferably within the range of about 5° to about 45°, more preferably within the range of about 5° to about 30°, and most preferably within the range of about 10° to about 20°.

Figure 7:
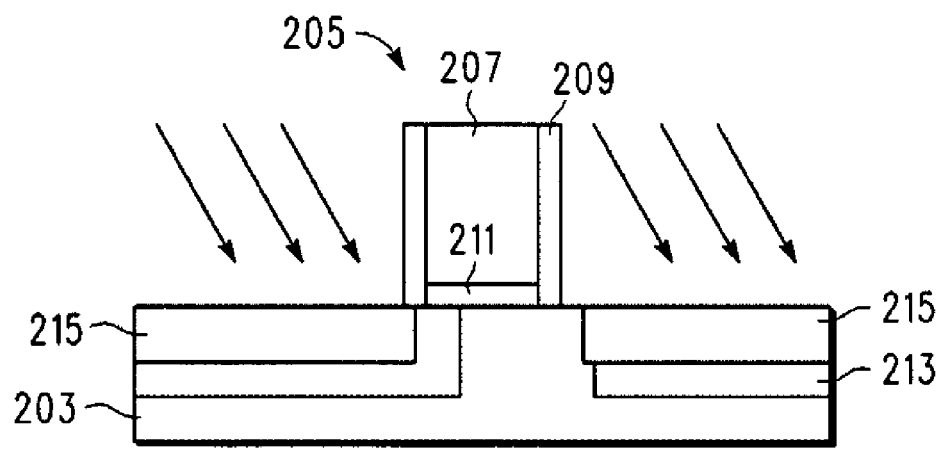
FIG. 7 is an illustration of a step in a process for making a MOSFET device in accordance with the teachings herein.

As shown in FIG. 7, asymmetric halo regions are then formed by implantation of a species of a second conductivity type using the gate structure 205 as an implant mask. Thus, for example, if the source/drain extension regions 213 are formed with an n-type dopant, the halo regions are formed with a p-type dopant. The halo implantation is preferably performed at a similar angle to the PAI.

Figure 8:
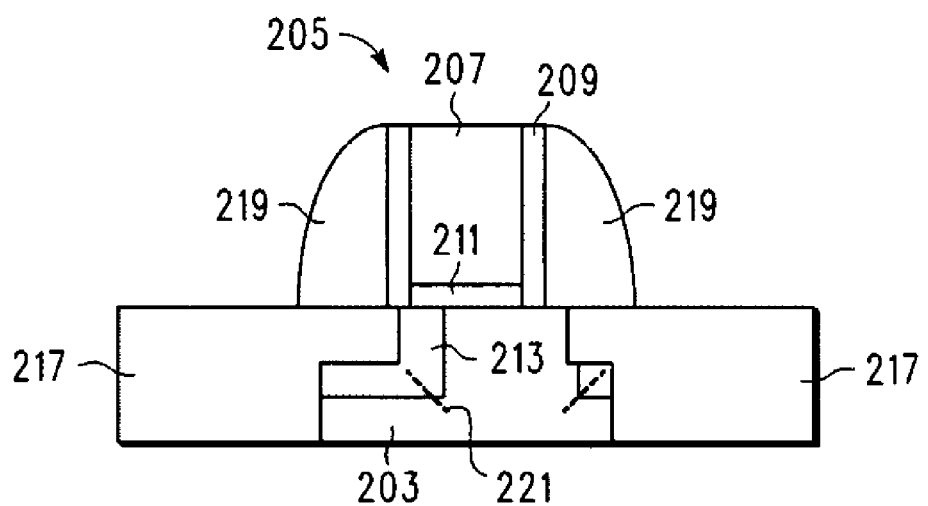
FIG. 8 is an illustration of a step in a process for making a MOSFET device in accordance with the teachings herein.

Referring now to FIG. 8, spacer structures 219, 220 are formed adjacent to the gate electrode 207 by depositing a suitable spacer material over the structure, and then subjecting the spacer material to anisotropic etching. A deep implant is then conducted, followed by an anneal, to form source 217 and drain 218 regions. The anneal may induce some diffusion in the dopant used to define the source 217 and drain 218 regions.

In addition to inducing diffusion in the dopant used to define the source 217 and drain 218 regions, the anneal also promotes recrystallization in the amorphous regions. As seen in FIG. 8, this results in the formation of end of range (EOR) defects 221 in these regions. Since the PAI region 213 is asymmetric, the EOR defects 221 are disposed asymmetrically about the gate electrode 205. Under suitable implant and anneal conditions, these EOR defects 221 form lines of defects. This results in source 217 EOR defects 221 being disposed closer to the center of the gate electrode than the drain 218 EOR defects 221. Hence, the EOR defects 221 introduce recombination centers preferentially in the source side of the device. Without wishing to be bound by theory, it is believed that these recombination centers help to control the floating body wherein the recombination centers due to the source 217 EOR defects have a stronger impact on the floating body potential than the recombination centers due to the drain 218 EOR defects.

The process of FIGS. 4-8 is advantageous over the process depicted in FIGS. 1-3 in that, by forming the first 213 and second 214 amorphized implant regions prior to forming the spacer structures 219 and 220, an additional sequence of photoresist deposition, implantation, and ashing is avoided. In embodiments of CMOS transistors made in accordance with the teachings herein in which different species are utilized to form the source and drain regions in the NMOS and PMOS regions of the device (for example, where arsenic ions are used to define the source and drain regions in the NMOS region of the device, and indium ions are used to define the source and drain regions in the PMOS region of the device), a second additional sequence of photoresist deposition, implantation, and ashing is avoided.

FIGS. 9-13 illustrate a second particular, non-limiting embodiment of a process for making an SOI transistor in accordance with the teachings herein.

Figure 9:
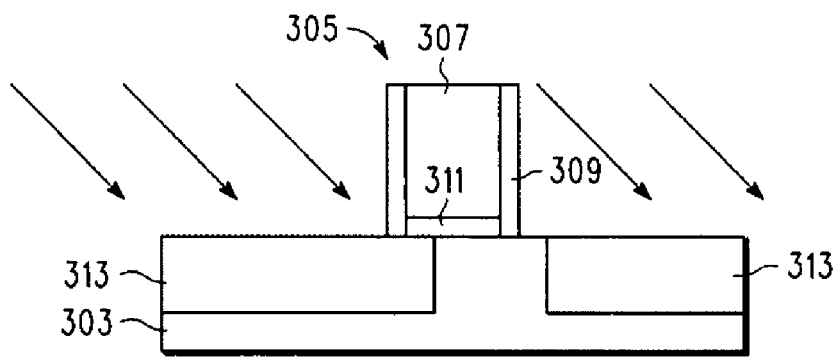
FIG. 9 is an illustration of a step in a process for making a MOSFET device in accordance with the teachings herein.

With reference to FIG. 9, a semiconductor structure 301 is provided which comprises an SOI layer 303 having a gate structure 305 defined thereon. The gate structure 305 comprises a gate electrode 307 insulated from the SOI layer 303 by way of a gate oxide 311. The sides of the gate electrode 307 are likewise covered with a layer of oxide 309 which may have a composition which is the same as, or different from, the composition of gate oxide 311.

The structure is subjected to a first pre-amorphization implantation (PAI) with an ion beam using a first dopant species to form a first set of PAI regions 313, 314. The PAI may be accomplished by implanting a suitable impurity of a first conductivity type into the SOI layer 303 at a high tilt angle in a manner analogous to the step depicted in FIG. 5. In some embodiments, this PAI implant may be done after junction profile optimization by the second PAI, extension and halo implantation described below.

Figure 10:
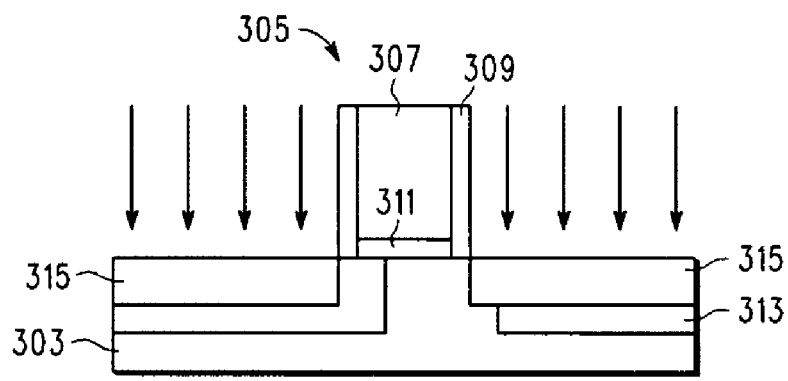
FIG. 10 is an illustration of a step in a process for making a MOSFET device in accordance with the teachings herein.

As shown in FIG. 10, the structure is then subjected to second PAI with an ion beam using a second dopant species to form a second set of PAI regions 315, 316 which can be used for junction profile optimization in combination with subsequent extension and halo implants. The second set of PAI regions 315, 316 may be formed by implanting a second dopant species of a first conductivity type into the SOI layer 303. In this particular embodiment, the tilt angle for the implantation step is essentially zero. Also, the second set of PAI regions 315, 316 is formed at a lower energy, and hence the second set of PAI regions 315, 316 is shallower than the first set of PAI regions 313, 314.

Figure 11:
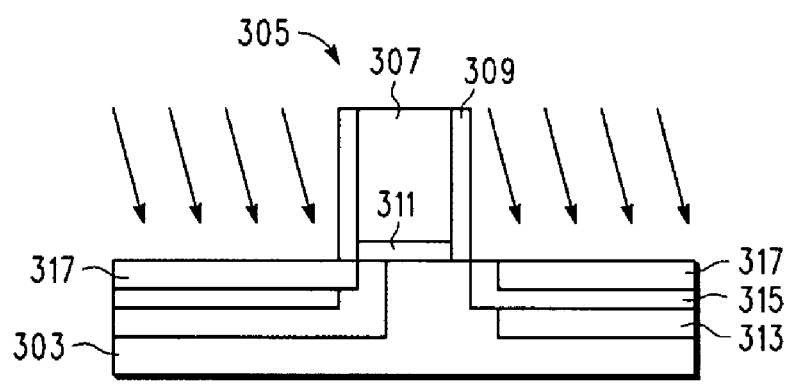
FIG. 11 is an illustration of a step in a process for making a MOSFET device in accordance with the teachings herein.

With reference to FIG. 11, source 317 and drain 318 extensions are then created by implantation of a species of a second conductivity type using the gate structure 305 as an implant mask, in a manner analogous to that depicted in FIG. 6. The implantation is performed at a steeper (but nonzero) angle compared to the PAI implant, and hence the source 317 and drain 318 extensions are formed asymmetrically about the gate electrode 307.

Figure 12:
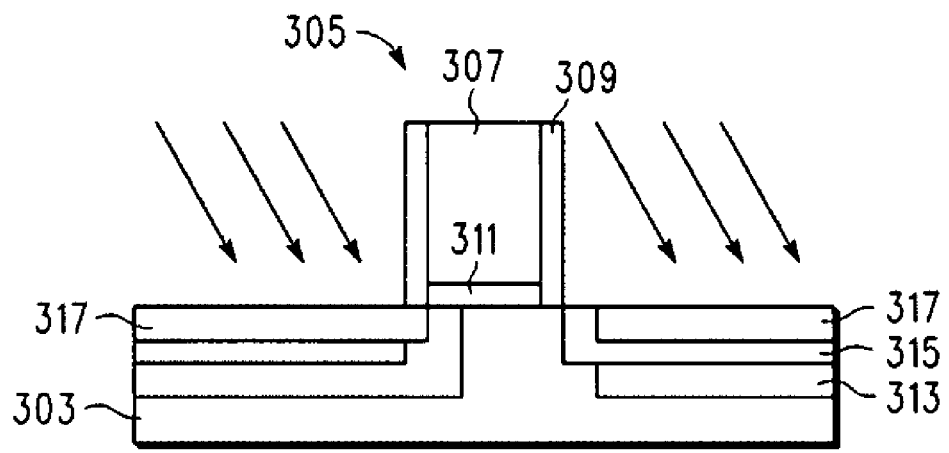
FIG. 12 is an illustration of a step in a process for making a MOSFET device in accordance with the teachings herein.

As shown in FIG. 12, asymmetric halo regions are then formed by implantation of a species of a first conductivity type using the gate structure 305 as an implant mask. Thus, for example, if the source 317 and drain 318 extensions are formed with an n-type dopant, the halo regions are formed with a p-type dopant. The halo implantation is preferably performed at a similar angle to the PAI.

Figure 13:
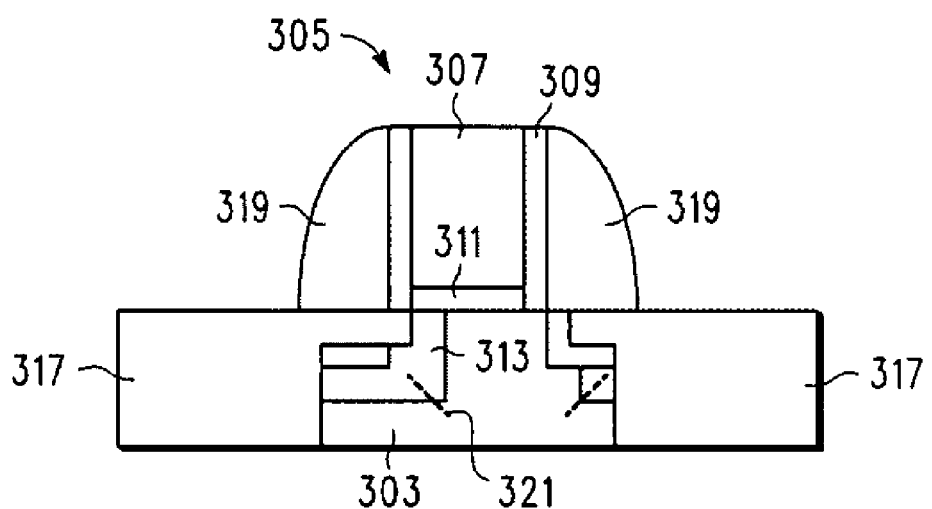
FIG. 13 is an illustration of a step in a process for making a MOSFET device in accordance with the teachings herein.

Referring now to FIG. 13, spacer structures 319, 320 are formed adjacent to the gate electrode 307 by depositing a suitable spacer material over the structure, and then subjecting the spacer material to anisotropic etching. A deep implant is then conducted, followed by an anneal, to form source 321 and drain 322 regions. The anneal may induce some diffusion in the dopant used to define the source 321 and drain 322 regions.

As with the previous embodiment, the anneal results in recrystallization in the amorphous regions, and anneals out most of the defects, while leaving behind end of range (EOR) defects 321 in these regions. Under suitable implant and anneal conditions, these EOR defects 321 form lines of defects. Since the first set of PAI regions 313, 314 and the second set of PAI regions 315, 316 are asymmetrically disposed about the gate electrode 307, the EOR defects 321 form regions which are disposed asymmetrically about the gate electrode 305 such that the line of source EOR defects 321 is disposed closer to the center of the gate electrode than the line of drain EOR defects 321. The EOR defects 321 introduce recombination centers preferentially in the source side of the device which, as previously noted, is believed to help to control the floating body effect by strongly influencing the body potential.

The embodiment depicted in FIGS. 9-13 is advantageous in that it utilizes two separate pre-amorphization implants, one for optimization of the halo and source/drain extension regions, and another for floating body reduction. Such an approach may be particularly useful where it is not possible to simultaneously achieve both of these ends with a single pre-amorphization implant, as may be the case where these goals represent competing considerations.

Figure 14:
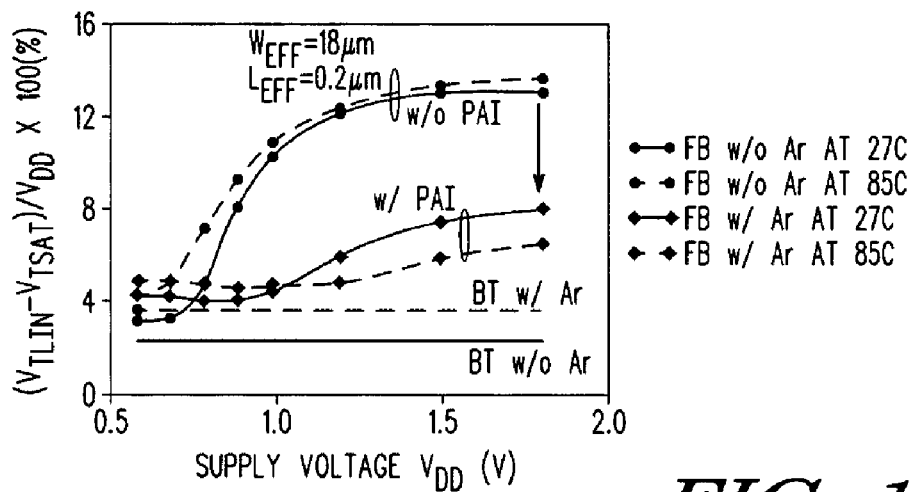
FIG. 14 is a graph of % $(V_{TLIN}-V_{TSAT})V_{DD}$ as a function of supply voltage (V)

The effect of a highly tilted PAI of the type depicted in FIGS. 5 and 9 may be understood with reference to the graph depicted in FIG. 14, which illustrates floating body potential as a function of supply voltage for an SOI device. The graph shows the results obtained at two different temperatures both with, and without, PAI. The PAI in this case was conducted with Argon as the dopant. As seen therein, PAI significantly reduced floating body potential at both temperatures.

Figure 15:
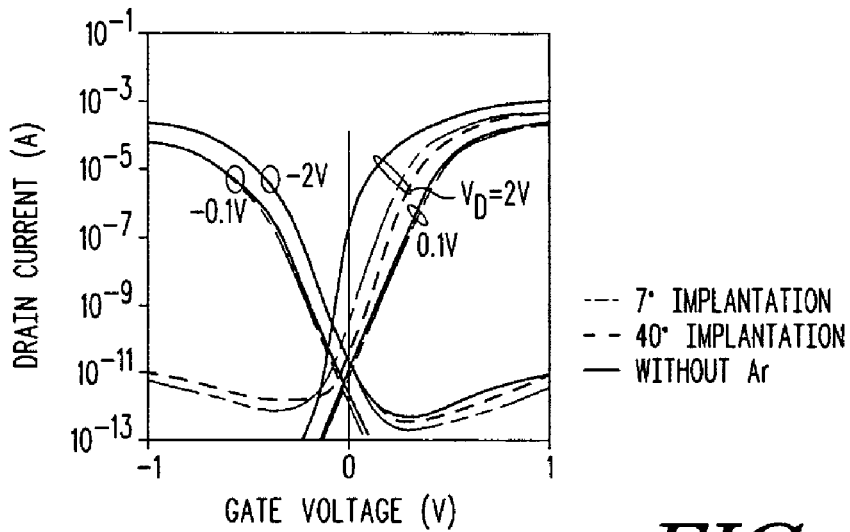
FIG. 15 is a graph of drain current (A) as a function of gate voltage (V)
Figure 16:
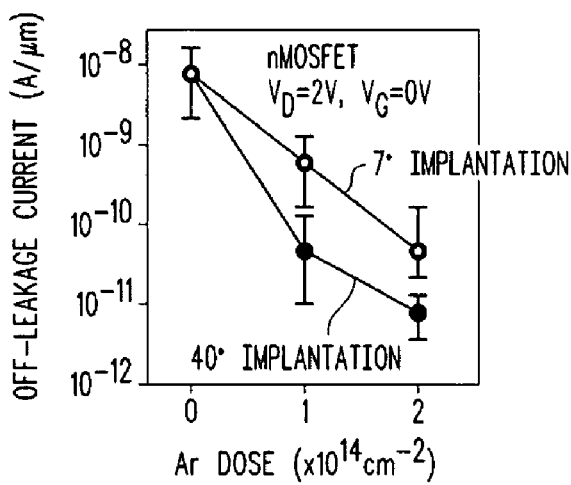
FIG. 16 is a graph of off-leak current (A/μm) as a function of Ar dose.

The effect of a highly tilted PAI of the type depicted in FIGS. 5 and 9 is further demonstrated with reference to the graphs depicted in FIGS. 15-16. In the graph shown in FIG. 15, drain current as a function of voltage was measured at positive and negative potentials for analogous devices formed with (a) a 7° PAI using Argon; (b) a 40° PAI using Argon; and (c) no PAI. The graph in FIG. 16 shows off-leakage current as a function of Argon dosage for the 7° and 40° implantations referenced in FIG. 15. As these graphs show, the floating body effect was observed to decline with increasing tilt angle.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
   providing a structure comprising a gate electrode disposed on a substrate;
   creating first and second pre-amorphization implant regions in the substrate such that the first and second pre-amorphization implant regions are asymmetrically disposed with respect to said gate electrode;
   creating first and second extension regions in the substrate adjacent, respectively, to first and second sides of the gate electrode,
   creating first and second spacer structures adjacent to first and second sides of the gate electrode such that the first and second spacer structures extend over the first and second pre-amorphization implant regions, respectively;
   creating source and drain regions in the substrate adjacent, respectively, to the first and second spacer structures; and
   forming end of range defects in the substrate adjacent to the boundaries of the first and second pre-amorphization implant regions; wherein the first and second extension regions are created prior to the creation of the first and second spacer structures.

2. The method of claim 1, wherein said first and second pre-amorphization implant regions are formed by implanting a first species at an angle $\phi$, and wherein $\phi$, as measured from an axis vertical to the substrate and in the direction of the source region, is within the range of about 20° to about 70°.

3. The method of claim 2, wherein $\phi$, as measured from an axis vertical to the substrate and in the direction of the source region, is within the range of about 30° to about 60°.

4. The method of claim 2, wherein $\phi$, as measured from an axis vertical to the substrate and in the direction of the source region, is within the range of about 40° to about 50°.

5. The method of claim 1, further comprising:
   creating a halo region in the substrate, wherein the halo region is created prior to the creation of the first and second spacer structures.

6. The method of claim 1, wherein the first and second extension regions are disposed asymmetrically about the gate electrode.

7. The method of claim 1, wherein the halo region comprises a first halo region disposed adjacent to the first extension region and a second halo region disposed adjacent to the second extension region, and wherein the first and second halo regions are disposed asymmetrically about the gate electrode.

8. The method of claim 1, wherein said first and second extension regions are formed by implanting a second species at an angle $\sigma_1$, and wherein $\sigma_1$, as measured from an axis vertical to the substrate and in the direction of the source region, is within the range of about 5° to about 45°.

9. The method of claim 1, wherein said first and second extension regions are formed by implanting a second species at an angle $\sigma_1$, and wherein $\sigma_1$, as measured from an axis vertical to the substrate and in the direction of the source region, is within the range of about 10° to about 30°.

10. The method of claim 1, wherein said first and second extension regions are formed by implanting a second species at an angle $\sigma_1$, and wherein $\sigma_1$, as measured from an axis vertical to the substrate and in the direction of the source region, is within the range of about 10° to about 20°.

11. The method of claim 1, wherein the first and second extension regions have a first conductivity type, and wherein the halo region has a second conductivity type that is opposite to the first conductivity type.

12. The method of claim 1, further comprising annealing the structure such that end of range defects are created in the substrate.

13. The method of claim 12, wherein the end of range defects are formed along first and second axes which are asymmetrically disposed about the gate electrode.

14. The method of claim 1, wherein the first and second pre-amorphozation implant regions are created by implanting a species selected from the group consisting of Si, Ge, Sb, In, As, P, $BF_2$, Xe and Ar.

15. The method of claim 14, wherein the first and second pre-amorphozation implant regions are created by implanting Ar.

16. The method of claim 1, wherein the substrate is an SOI wafer.

17. The method of claim 16, wherein the semiconductor device is a MOSFET.

18. The method of claim 1, wherein the pre-amorphization regions are formed through implantation of a first dopant, wherein the source and drain regions are formed by implantation of a second dopant, and wherein the first and second dopants have opposite conductivities.

19. The method of claim 1, further comprising:
   creating third and fourth pre-amorphization implant regions in the substrate such that the first and second pre-amorphization implant regions are asymmetrically disposed with respect to said gate electrode.

* * * * *